US012723300B2

(12) United States Patent
Hong et al.

(10) Patent No.: US 12,723,300 B2
(45) Date of Patent: Sep. 1, 2026

(54) HIGH-ENTROPY ALLOY COATING MATERIAL AND ITS MANUFACTURING METHOD

(71) Applicant: INNOTION TECH CO., LTD., Siheung-si (KR)

(72) Inventors: Jeong Ki Hong, Siheung-si (KR); In Ki Hong, Siheung-si (KR); Myoung Ki Hong, Ulsan (KR); Min Seok Park, Gimpo-si (KR)

(73) Assignee: INNOTION TECH CO., LTD., Siheung-si (KR)

( * ) Notice: Subject to any disclaimer, the term of this patent is extended or adjusted under 35 U.S.C. 154(b) by 0 days.

(21) Appl. No.: 19/136,196

(22) PCT Filed: Oct. 2, 2024

(86) PCT No.: PCT/KR2024/015015
§ 371 (c)(1),
(2) Date: Jun. 5, 2025

(87) PCT Pub. No.: WO2026/071313
PCT Pub. Date: Apr. 2, 2026

(65) Prior Publication Data

US 2026/0002247 A1 Jan. 1, 2026

(30) Foreign Application Priority Data

Sep. 24, 2024 (KR) ........................ 10-2024-0128783

(51) Int. Cl.
*C23C 14/06* (2006.01)
*C23C 14/34* (2006.01)

(52) U.S. Cl.
CPC ...... *C23C 14/0635* (2013.01); *C23C 14/3414* (2013.01)

(58) Field of Classification Search
CPC ............ C23C 14/0635; C23C 14/3414; C23C 14/0021; Y02E 60/10
See application file for complete search history.

(56) References Cited

U.S. PATENT DOCUMENTS

2025/0171907 A1 5/2025 Hong et al.

FOREIGN PATENT DOCUMENTS

| | | | |
|---|---|---|---|
| CN | 118147508 | A | 6/2024 |
| KR | 10-1927611 | B1 | 12/2018 |
| KR | 101955370 | B1 | 3/2019 |
| KR | 1020200040970 | A | 4/2020 |
| KR | 1020220078647 | | 6/2022 |

(Continued)

OTHER PUBLICATIONS

KR-20240001846-A Translation (Year: 2024).*

(Continued)

*Primary Examiner* — Patrick S Ott
(74) *Attorney, Agent, or Firm* — LADAS & PARRY LLP

(57) ABSTRACT

The objective of the present invention is to design a novel coating material applied to the surface of industrial rollers used in the manufacturing process of secondary batteries and to provide a method for forming the coating material. In accordance with this objective, the present invention provides a roller surface coating material composed of Ni—Co—Cr—Si—N, utilizing a high-entropy alloy target containing Ni—Co—Cr—Si.

22 Claims, 3 Drawing Sheets

(56) References Cited

FOREIGN PATENT DOCUMENTS

| | | | | | |
|---|---|---|---|---|---|
| KR | 10-2024-0001846 | | | 1/2024 | |
| KR | 10-2024-0001846 | A | | 1/2024 | |
| KR | 20240001846 | A | * | 1/2024 | ............ C22C 30/00 |
| KR | 10-2639397 | | | 2/2024 | |
| KR | 10-2639397 | B1 | | 2/2024 | |
| KR | 10-2024-0047106 | A | | 4/2024 | |

OTHER PUBLICATIONS

Notification of Examination Result (Office Action) issued by the Korean Intellectual Property Office (KIPO) mailed Nov. 16, 2024 on copending Application No. 10-2024-0128783.

Amendment submitted in response to the KIPO Office Action submitted on Dec. 20, 2024 on copending Application No. 10-2024-0128783.

Argument in support of patentability filed in KIPO submitted on Dec. 20, 2024 on copending Application No. 10-2024-0128783.

Decision to Grant issued by KIPO dated May 26, 2025 on copending Application No. 10-2024-0128783.

* cited by examiner

[FIG.1]
| candidate | HIT(Gpa) | EIT(Gpa) |
|---|---|---|
| NCM0 | 11.3 | 251.4 |
| NCM1 | 10.89 | 182.9 |
| NCM2 | 9.23 | 198.4 |
| NCM3 | 11.1 | 245.1 |
| NCM4 | 10.7 | 198 |
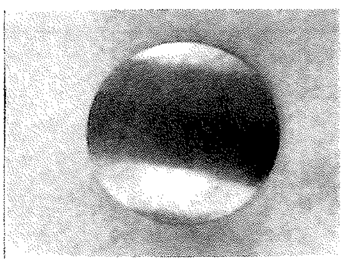
[FIG.2]
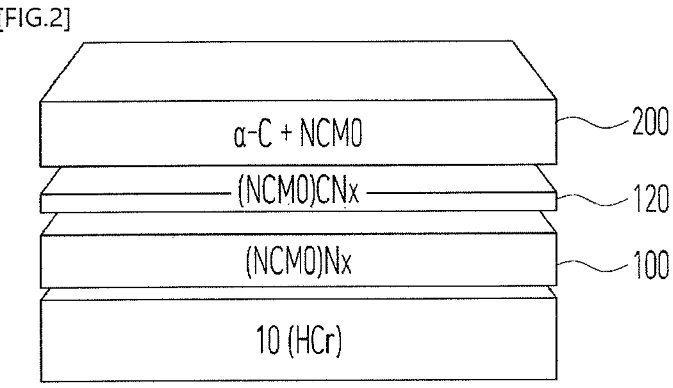
[FIG.3]
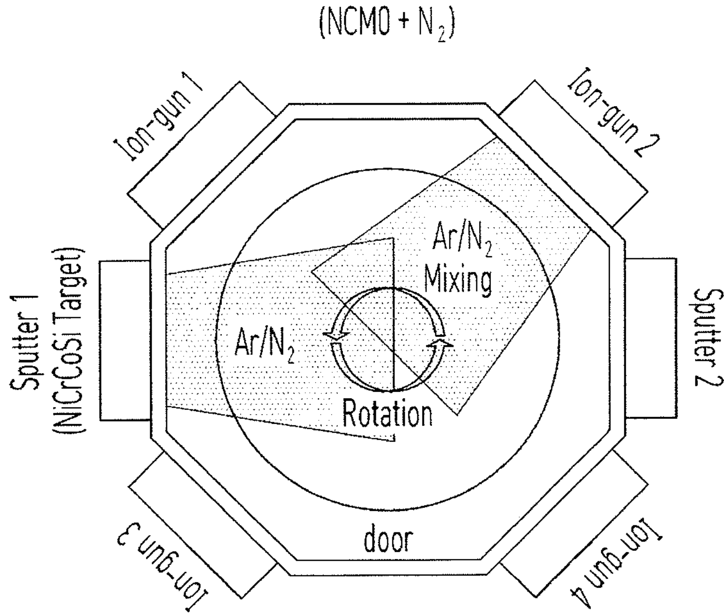

[FIG.4]
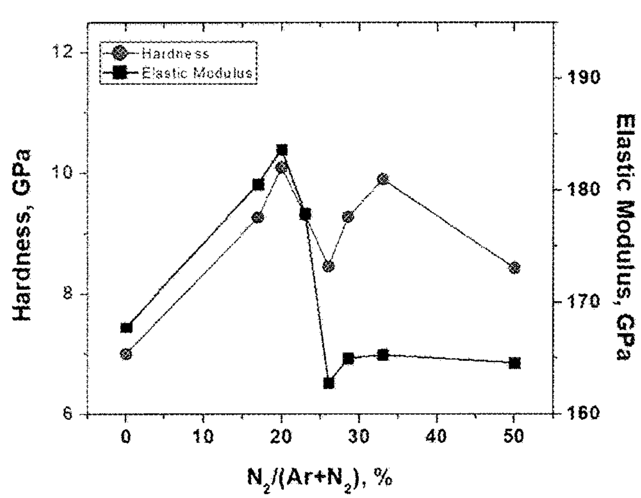
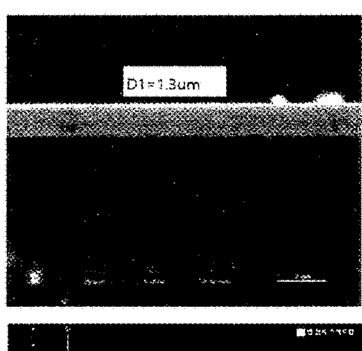
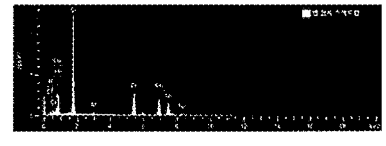
[FIG.5]
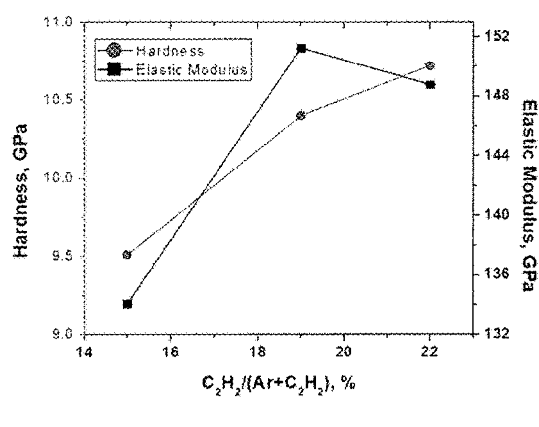
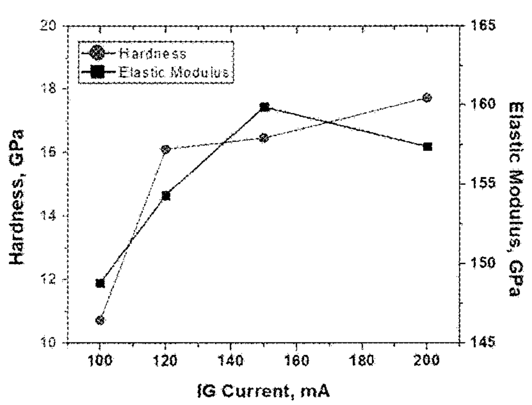
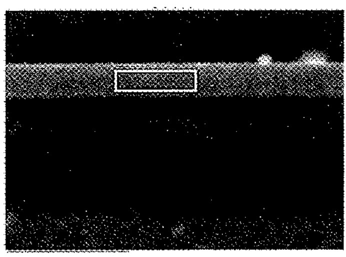
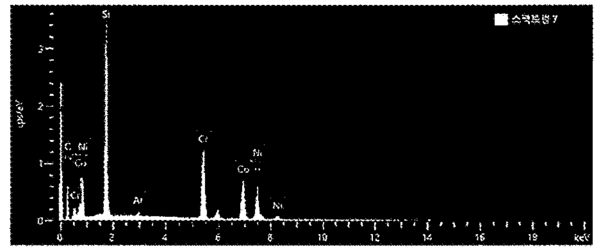

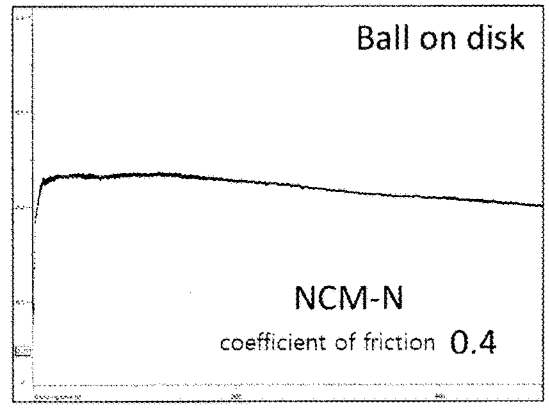
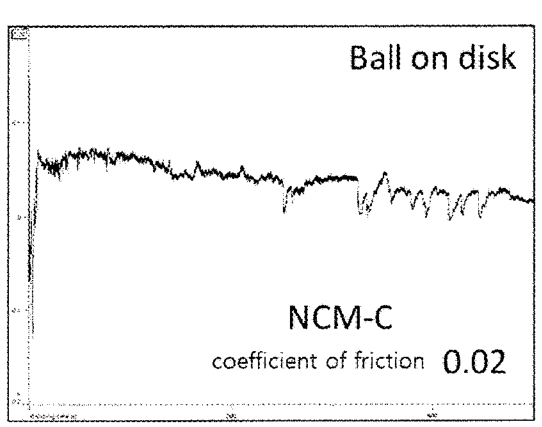
| Classification | adhesion strength (Rockwell-C indentation) | Coefficient of friction (friction wear test) |
|---|---|---|
| NCM-N | HF1 | 0.4 |
| NCM-C | HF1 | 0.02 |
[FIG. 6]

HIGH-ENTROPY ALLOY COATING MATERIAL AND ITS MANUFACTURING METHOD

CROSS-REFERENCE TO RELATED APPLICATIONS

This application is a national phase application of International application PCT/KR2024/015015 filed on Oct. 2, 2024 that claims the priority of Korean Patent Application No. 10-2024-0128783 filed on Sep. 24, 2024. The content of these applications is incorporated herein by reference in its entirety.

TECHNICAL FIELD

The present invention relates to a high-entropy alloy coating material and its manufacturing method. More specifically, it pertains to a surface coating material and its manufacturing process, which can be applied to rollers and other components included in secondary battery manufacturing equipment.

BACKGROUND TECHNOLOGY

High-entropy alloys (HEA) exhibit high stability and excellent mechanical properties. These alloys are applied in various fields such as aerospace technology, nuclear engineering, and cryogenic applications.

Korean Patent No. 10-1955370 describes a technique for forming a high-entropy alloy thin film (CoaCrbFecMndNie) 1-x-yNxOy on inexpensive metals such as SUS or flexible substrates.

Meanwhile, in the manufacturing process of electric vehicle batteries, numerous rollers are used in different stages, including anode and cathode production. The surface of these rollers must possess high hardness, wear resistance, and low friction properties while also ensuring long-term usability without adhesion issues with electrode materials.

Rollers used in the production of cathode materials such as NCM and anode materials like carbon or silicon are exposed to harsh conditions where dry powders are compressed, leading to significantly reduced lifespan. To extend the roller surface lifespan, surface coating technologies are applied.

Currently, commercialized wet plating technology requires a large amount of chemical solutions in liquid form, yet results in low density, low durability, and generates many pores and residual substances, making it challenging to form a high-purity coating layer.

CONTENTS OF THE INVENTION

Technical Problem

The objective of the present invention is to design a new coating material applied to the surface of industrial rollers used in the secondary battery manufacturing process and to provide a method for its formation.

Specifically, the purpose of this invention is to offer a new coating material for rollers used in the secondary battery manufacturing process, ensuring high durability, anti-adhesion properties, and excellent surface smoothness (surface roughness), while also maintaining the high purity of the electrode materials produced by the rollers.

Means for Solving the Problem

According to the objective of the present invention, a roller surface coating material composed of Ni—Co—Cr—Si—N is provided by utilizing a high-entropy alloy target containing Ni—Co—Cr—Si.

In this context, the high-entropy alloy target containing Ni—Co—Cr—Si can be designed with the following composition: Ni: 17-25%, Co: 17-25%, Cr: 17-25%, Si: 25-49%.

Furthermore, the high-entropy alloy target containing Ni—Co—Cr—Si can be manufactured by casting, sintering, or atomization of high-purity fine alloy powder, followed by sintering.

The present invention provides a coating material applied to the surface of industrial rollers, characterized by being composed of a high-entropy alloy represented by the formula: $Ni_aCo_bCr_cSi_dC_f$, where:

$$3<a<10,\ 3<b<10,\ 3<c<10,\ 5<d<15,\ 50<f<90,$$
$$a+b+c+d+f=100$$

Additionally, before forming the coating material, the invention includes:

- a first buffer layer made of Ni—Co—Cr—Si—N, applied to the roller surface, and
- a second buffer layer made of Ni—Co—Cr—Si—C—N, applied on top of the first buffer layer.

The present invention provides a coating material applied to the surface of industrial rollers, characterized by being composed of a high-entropy alloy represented by the formula: $Ni_aCo_bCr_cSi_dN_e$, where:

$$5<a<15,\ 5<b<15,\ 5<c<15,\ 25<d<40,\ 25<e<35,$$
$$a+b+c+d+e=100.$$

Additionally, prior to forming the coating material, the invention includes:

- a first buffer layer made of Ni—Co—Cr—Si—N, applied to the surface of the industrial roller, and a second buffer layer made of Ni—Co—Cr—Si—N, deposited on top of the first buffer layer,
- wherein the first and the second buffer layers feature a nitrogen (N) composition gradient, wherein the nitrogen content gradually increases from the substrate surface toward the top layer.

The present invention provides a coating material applied to the surface of industrial rollers, comprising:

- a first buffer layer made of Ni—Co—Cr—Si—C, applied directly to the roller surface,
- a second buffer layer made of Ni—Co—Cr—Si—C, deposited on top of the first buffer layer, and
- a top layer composed of a high-entropy alloy, represented by the formula: $Ni_aCo_bCr_cSi_dC_f$, where:

$$3<a<10,\ 3<b<10,\ 3<c<10,\ 5<d<15,\ 50<f<90,$$
$$a+b+c+d+f=100.$$

Additionally, the first and second buffer layers feature a carbon (C) composition gradient, wherein the carbon content gradually increases from the substrate surface toward the top layer.

The present invention provides a coating material applied to the surface of industrial rollers, characterized by being composed of a high-entropy alloy represented by the formula: $Ni_aCo_bCr_cSi_d$, where:

$$17 \leq a \leq 25,\ 17 \leq b \leq 25,\ 17 \leq c \leq 25,\ 25 \leq d \leq 49,$$

$$a+b+c+d=100.$$

The present invention further provides a coating system for forming a coating material on the surface of rollers used in the secondary battery manufacturing process, comprising:

a chamber, a sputter source, and an ion source, in this system, a high-entropy alloy target containing Ni—Co—Cr—Si is mounted onto the sputter source, the vacuum level within the chamber is adjusted, and nitrogen along with inert gas is supplied to the ion source, by applying power to both the sputter source and the ion source, a roller surface coating material composed of Ni—Co—Cr—Si—N is formed.

In the described system, the roller surface coating material composed of Ni—Co—Cr—Si—N has the following composition:

Ni, Co, and Cr: 10.0-13.0 atomic % (at %) each, Si: 34.0-39.0 at %, the remainder consists of N (Nitrogen).

By supplying hydrocarbon instead of nitrogen to the ion source, the system enables the formation of a Ni—Co—Cr—Si—C roller surface coating material.

The Ni—Co—Cr—Si—C roller surface coating material has the following composition:

Ni, Co, and Cr: 4.4-6.5 at % each, Si: 10.5-12.0 at %, the remainder consists of C (Carbon).

Effects of the Invention

According to the present invention, a high-entropy alloy target based on NCM, a cathode material for secondary batteries, is designed, and a coating material is formed on the roller surface using this target. This improves the durability, thermal stability, and anti-adhesion properties of the roller while maintaining the purity of the manufactured electrode material.

Furthermore, due to the stability exhibited by the high-entropy alloy, the coating surface enhances stability under high line pressure and high-temperature conditions applied to the roller.

The quaternary or higher high-entropy alloy coating material of the present invention forms a single-phase structure, exhibiting high strength at low, room ambient, and high temperatures. It also offers excellent thermal stability, structural stability, and corrosion resistance.

As a result, the coating material of the present invention is suitable for both cold-rolling and hot-rolling rollers.

Additionally, the present invention improves hardness and low friction properties by doping nitrogen and/or carbon into the high-entropy alloy coating material.

The mechanical hardness (HIT) of the coating material produced according to the present invention ranges from 7 to 17.73 GPa, the elastic modulus (EIT) is between 162.8 and 189.1 GPa, and the Vickers hardness (Hv) varies from 661.5 to 1675.4. The nitrogen and/or carbon content can be controlled to achieve the desired physical properties by adjusting the nitrogen and/or hydrocarbon partial pressure during processing.

BRIEF DESCRIPTION OF DRAWINGS

FIG. 1 is a table summarizing the hardness and elastic modulus of candidate coating materials according to the present invention, along with an image of the high-entropy alloy target.

FIG. 2 is a layered structural diagram of the coating material according to the present invention.

FIG. 3 is a schematic planar cross-sectional view illustrating the configuration of the coating system according to the present invention.

FIG. 4 presents a graph showing the mechanical property variations of the coating material based on the nitrogen composition supplied to the ion source in the coating system of FIG. 3. It also includes a TEM image confirming the thickness of the coating material and an XRD spectrum image verifying its composition.

FIG. 5 shows a graph illustrating the mechanical property variations of the coating material based on carbon doping and ion source current in the coating system of FIG. 3. Additionally, it includes a TEM image for coating thickness verification and an XRD spectrum image for composition analysis.

FIG. 6 provides a graph and table showing the friction coefficient and adhesion strength of the coating material according to the present invention.

BEST MODE FOR CARRYING OUT THE INVENTION

The preferred embodiments of the present invention will be described in detail below with reference to the accompanying drawings.

Conventional industrial rollers are primarily coated with Cr via wet coating on SUS or copper substrates. However, wet coating has severe environmental pollution issues and the coating layer easily peels off, leading to a short lifespan.

Thus, this invention aims to coat the roller surface using an eco-friendly dry hybrid plasma nano-composite coating. The dry coating process is completely free from pollutant emissions, making it environmentally friendly.

The cathode material of secondary batteries, NCM, consists of Ni, Co, and Mn. These cathode materials, along with carbon or silicon-based anode materials, are manufactured into electrodes through roller pressing.

To extend the lifespan of the rollers, a durable coating layer is formed on the roller surface. This coating must possess durability and anti-adhesion properties while maintaining strength stability, thermal stability, structural integrity, and corrosion resistance at both low and high temperatures. These attributes are crucial for prolonging the roller's lifespan and ensuring the high purity of the compressed material during the pressing process.

Thus, the coating material must exhibit anti-adhesion (non-stick) characteristics, strong bonding strength, and structural stability. Additionally, the possibility of trace incorporation of coating composition into electrode materials must be considered. In this regard, high-entropy alloy materials are well-suited as candidates for coating materials.

Depending on their design, HEA (High-Entropy Alloy) or transition metal-based nano-composite coating materials can form multifunctional coating layers with high density, high purity, and excellent durability.

Elements exhibiting the desired physical properties are alloyed and processed into an alloy target, which is then used for sputtering to form an alloy coating layer. Additionally, by integrating an ion source into the coating equipment and supplying gas-phase elements that enhance material properties, the coating material's performance can be further improved.

FIG. 1 presents a table summarizing the hardness (HIT) and elastic modulus (EIT) of five NCM-based alloy materials selected as candidate roller coating materials, along with images of the alloy targets.

In this invention, the coating material is designed with a composition similar to electrode materials but consists of a quaternary or higher high-entropy alloy. Accordingly, high-entropy alloy targets are fabricated and sputtering is employed to form the coating layer.

As will be described later, an ion source is incorporated to introduce nitrogen and/or carbon into the coating material.

In this invention, an alloy target for coating material is designed with Ni—Co—Cr—Si and fabricated as a high-entropy alloy. Typically, high-entropy alloys are composed with equal proportions of each constituent element. However, slight composition adjustments can be made to achieve the desired physical properties.

As shown in the table in FIG. 1, the alloy composition is systematically varied and analyzed to explore material properties, allowing for the selection of the optimal composition that yields the best results.

The coating material utilizing a high-entropy alloy target is designed with a composition similar to electrode materials. Thus, even if trace amounts of the coating material mix with the electrode material during the rolling process, the purity of the electrode is scarcely affected.

Furthermore, the coating material containing high-entropy alloys exhibits excellent substrate bonding adhesion, anti-adhesion (non-stick) properties, and structural stability, minimizing the risk of contamination during the rolling process.

The high-entropy alloy target in this invention, containing Ni—Co—Cr—Si, can be designed with the following composition: Ni: 17-25%, Co: 17-25%, Cr: 17-25%, Si: 25-49%.

The manufacturing process of the high-entropy alloy target involves casting, sintering, and atomization to produce high-purity fine alloy powder, followed by sintering of the powder.

The coating material design utilizing the manufactured high-entropy alloy target incorporates nitrogen (N) and/or carbon (C) to enhance its mechanical properties.

The quaternary or higher high-entropy alloy coating material developed in this invention forms a single-phase structure, exhibiting high strength across low, ambient, and high temperatures. Additionally, it offers superior thermal stability, structural integrity, and corrosion resistance, making it suitable for both cold rolling and hot rolling applications.

FIG. 2 illustrates the layered structure of the coating material according to the present invention.

A first buffer layer (100) and a second buffer layer (120) are formed on the substrate (10), followed by the formation of the top layer (200). The multi-layer buffer design enhances adhesion between the coating layer and the substrate while improving durability.

The substrate (10) can be HCr, for example, but the coating material of this invention can be applied to various substrates, including metals.

The formation of the coating material is carried out using a hybrid coating system (refer to FIG. 3), in which sputter sources and ion sources are radially arranged around the rotating substrate (on a turntable) as follows.

First Embodiment

The first buffer layer (100) is composed of Ni—Co—Cr—Si—N material, formed by sputtering a high-entropy alloy target while utilizing an ion source. The second buffer layer (120) consists of Ni—Co—Cr—Si—N—C, while the top layer (200) is made of Ni—Co—Cr—Si—C, with the carbon in the top layer being amorphous carbon.

During the formation of the first buffer layer (100), the plasma discharge gas supplied from the sputter source consists of inert gas (80 to 100 sccm) and nitrogen (0 to 100 sccm). The gas supplied to the ion source includes inert gas (80 to 100 sccm) and nitrogen (0 to 100 sccm). The nitrogen partial pressure in the chamber is adjusted to 0 to 50%.

During the formation of the second buffer layer (120), the plasma discharge gas supplied from the sputter source consists of inert gas (80 to 100 sccm) and nitrogen (0 to 100 sccm). The gas supplied to the ion source consists of inert gas (80 to 100 sccm) and hydrocarbon gas (12 to 14.5 sccm). At this stage, the nitrogen partial pressure in the chamber is lower than that during the formation of the first buffer layer, and the hydrocarbon partial pressure is lower than that during the formation of the top layer. During the formation of the top layer (200), only inert gas (50 to 80 sccm) is supplied to the sputter source, while hydrocarbon gas (12 to 14.5 sccm) is supplied to the ion source. The partial pressure of hydrocarbons is adjusted to 15 to 22% relative to the total amount of inert gas and hydrocarbons in the chamber. A higher hydrocarbon partial pressure enhances HIT and Hv properties.

The ion source current is controlled within the range of 100 to 200 mA, with higher ion source current leading to improvements in HIT, Hv, and EIT properties. The sputter source is supplied with a current of 0.8 to 1.5 A, while the bias voltage applied to the substrate is maintained between 80 and 120 V.

Additionally, before forming the first buffer layer, it is desirable to perform plasma cleaning on the substrate by introducing inert gas into the ion source. Specifically, the initial vacuum chamber is evacuated to a pressure of $10^{-5}$ to $10^{-3}$ torr, and the ion source is supplied with a current of 30 to 120 mA and a voltage of 1000 to 2000 V. Inert gas (e.g., Ar) is introduced at a flow rate of 10 to 20 sccm to plasma-clean the substrate surface.

Second Embodiment

The buffer and top layers are composed of Ni—Co—Cr—Si—N material, with the nitrogen (N) composition gradually increasing through the buffer layers to form a gradation structure. The top layer maintains a predetermined constant ratio of nitrogen.

Specifically, the plasma discharge gas supplied from the sputter source consists of inert gas (80 to 100 sccm) and nitrogen (0 to 100 sccm), while the gas supplied to the ion source contains inert gas (5 to 7 sccm) and nitrogen (5 to 7 sccm). The nitrogen partial pressure in the chamber is controlled within a range of 0 to 50%, gradually increasing through the first and second buffer layers. During the formation of the top layer, the nitrogen partial pressure is maintained at 17 to 23% relative to the total chamber pressure, including inert gas and nitrogen.

As nitrogen partial pressure increases from 0%, HIT, Hv, and EIT properties improve. However, exceeding a certain threshold leads to a decline in these characteristics, making it desirable to determine an optimal nitrogen pressure range.

The ion source current is adjusted between 100 and 200 mA.

Additionally, before forming the first buffer layer, it is preferable to perform plasma cleaning on the substrate by introducing inert gas into the ion source.

The initial vacuum conditions, plasma cleaning process, and sputtering conditions for buffer layer formation are the same as those in the first embodiment.

Third Embodiment

The buffer and top layers are composed of Ni—Co—Cr—Si—C material, with the carbon (C) composition gradually increasing through the buffer layers to form a gradation structure, while the top layer maintains a predetermined constant ratio of carbon.

Specifically, the plasma discharge gas supplied from the sputter source consists of inert gas (50 to 80 sccm), while hydrocarbon gas (12 to 14.5 sccm) is supplied to the ion source. The hydrocarbon partial pressure in the chamber is controlled within the range of 15 to 22%. Through the first and second buffer layers, the hydrocarbon partial pressure is progressively increased, and during the formation of the top layer, it is maintained at 19 to 22% relative to the total chamber pressure, including inert gas and hydrocarbons.

Higher hydrocarbon partial pressure enhances HIT and Hv properties.

The ion source current is controlled within a range of 100 to 200 mA. Increasing the ion source current improves HIT, Hv, and EIT properties.

Additionally, before forming the first buffer layer, it is preferable to perform plasma cleaning on the substrate by introducing inert gas into the ion source.

The initial vacuum conditions, plasma cleaning parameters, and sputtering conditions during buffer layer formation are identical to those described in the first embodiment.

Fourth Embodiment

The coating material applied to the surface of industrial rollers can be composed of a high-entropy alloy with the formula $Ni_aCo_bCr_cSi_d$, where 17≤a≤25, 17≤b≤25, 17≤c≤25, 25≤d≤49, and a+b+c+d=100. In this case, a separate buffer layer is not required.

For the formation of the coating material, only inert gas (50 to 80 sccm) is supplied to the sputter source. The sputter source operates with a current of 0.8 to 1.5 A, while the bias voltage applied to the substrate is set between 80 and 120 V.

Additionally, before forming the coating layer, it is preferable to perform plasma cleaning on the substrate by introducing inert gas into the ion source.

Specifically, the initial vacuum chamber is evacuated to a pressure of $10^{-5}$ to $10^{-3}$ torr. The ion source is supplied with a current of 30 to 120 mA and a voltage of 1000 to 2000 V, while inert gas (e.g., Ar) is introduced at a flow rate of 10 to 20 sccm to plasma-clean the substrate surface.

All the embodiments described are carried out as room-temperature processes without the use of a separate heater.

The mechanically processed coating materials exhibit hardness (HIT) in the range of 7~17.73 GPa, elastic modulus (EIT) between 162.8~189.1 GPa, and Hv values from 661.5 to 1675.4.

Specifically, the roller surface coated with Ni—Co—Cr—Si—N material demonstrates a hardness of HIT=9.27~11.81 GPa, Hv=875.9~1116.0, and an elastic modulus of EIT=180.6~189.1 GPa. Meanwhile, the roller surface coated with Ni—Co—Cr—Si—C material exhibits a hardness of HIT=9.51~17.73 GPa, Hv=898.6~1675.4, and an elastic modulus of EIT=134.01~159.885 GPa.

The inclusion of carbon in the coating material enhances not only high-hardness properties but also provides low-friction characteristics.

FIG. 6 presents a graph and table illustrating the friction coefficient and adhesion strength of the coating materials according to the present invention.

The Ni—Co—Cr—Si—N coating material exhibited a friction coefficient of 0.4, whereas the Ni—Co—Cr—Si—C coating material demonstrated low friction with a coefficient of 0.02.

Thus, by appropriately adjusting the carbon (C) content in the Ni—Co—Cr—Si—N—C coating material, the friction coefficient can be controlled within the range of 0.02 to 0.4.

Furthermore, in the Ni—Co—Cr—Si—N coating material, adding carbon (C) to the second buffer layer and adjusting its content allows for a reduction in the friction coefficient.

Both Ni—Co—Cr—Si—N and Ni—Co—Cr—Si—C coating materials exhibit excellent adhesion strength, rated as HF1.

Alternatively, by modifying the above embodiments, as a coating material applied to the surface of industrial rollers, a coating material includes:

- a top layer composed of the high-entropy alloy with the composition $Ni_aCo_bCr_cSi_dN_eC_f$,
- a first buffer layer composed of Ni—Co—Cr—Si—N, and
- a second buffer layer composed of Ni—Co—Cr—Si—N—C on top of the first buffer layer, where:

$$3 < a < 15,\ 3 < b < 15,\ 3 < c < 15,$$
$$5 < d < 40,\ 25 < e < 35,\ 35 < f < 65, \text{ and}$$
$$a + b + c + d + e + f = 100.$$

Unless otherwise defined, all technical and scientific terms used in this specification have the same meanings as commonly understood by those skilled in the art to which this invention pertains. Additionally, terms generally defined in dictionaries should not be interpreted in an idealized or overly broad manner unless explicitly redefined herein.

Throughout this specification, when a component is described as "including" a certain element, it should be understood that, unless explicitly stated otherwise, the component may incorporate additional elements rather than excluding them. Furthermore, singular forms may include plural forms depending on the context.

In this specification, the terms "on," "above," or "upper" and "below" or "lower" indicate relative positioning of components and do not necessarily imply an orientation based on gravitational direction.

The rights of the present invention are not limited to the embodiments described above but are instead defined by the claims. It is evident that a person skilled in the field of the invention can make various modifications and adaptations within the scope defined by the claims.

INDUSTRIAL APPLICABILITY

The present invention can be applied to rollers used in secondary battery manufacturing equipment.

The invention claimed is:

1. A coating material applied to a surface of an industrial roller, comprising a high-entropy alloy $Ni_aCo_bCr_cSi_dC_f$, wherein 3<a<10, 3<b<10, 3<c<10, 5<d<15, 55<f<86, and a+b+c+d+f=100, wherein the industrial roller is a roller for manufacturing an electrode comprising an NCM (Ni, Co, Mn) cathode material for a secondary battery.

2. The coating material of claim 1, further comprising a first buffer layer made of Ni—Co—Cr—Si—N on the surface of the industrial roller and a second buffer layer made of Ni—Co—Cr—Si—C—N on top of the first buffer layer, before forming the coating material.

3. The coating material of claim 1, wherein a mechanical hardness HIT is 7~17.73 GPa, an elastic modulus EIT is 162.8~189.1 GPa, and Hv is 661.5~1675.4 and a coefficient of friction is 0.02 or more and less than 0.4.

4. A method for forming a high-entropy alloy coating material according to claim 1, comprising:

preparing an industrial roller and a high-entropy alloy target designed with the following composition: Ni: 17~25%, Co: 17~25%, Cr: 17~25%, Si: 25~49%;

loading the industrial roller into a chamber;

vacuumizing the chamber;

supplying inert gas, and hydrocarbon gas into the chamber and generating plasma;

forming a high-entropy alloy coating material $Ni_aCo_bCr_cSi_dC_f$, where: 3<a<10, 3<b<10, 3<c<10, 5<d<15, 55<f<86, and a+b+c+d+f=100, on a surface of the industrial roller.

5. The method for forming a high-entropy alloy coating material according to claim 4, wherein:

the inert gas is supplied through a sputter source at 50 to 80 sccm, the hydrocarbon gas is supplied through an ion source at 12 to 14.5 sccm, and a partial pressure of the hydrocarbon gas is adjusted to 15 to 22% of a total amount of inert gas and hydrocarbon gas within the chamber.

6. The method for forming a high-entropy alloy coating material according to claim 5, wherein:

an ion source current is controlled within a range of 100 to 200 mA to regulate mechanical properties of the coating material.

7. The method for forming a high-entropy alloy coating material according to claim 4, wherein:

before forming the high-entropy alloy coating material as a top layer, a first buffer layer composed of Ni—Co—Cr—Si—N is formed on the surface of the industrial roller, and a second buffer layer composed of Ni—Co—Cr—Si—C—N is formed on top of the first buffer layer;

to form the first buffer layer, inert gas (80 to 100 sccm) and nitrogen (greater than 0 and less than or equal to 100 sccm) are supplied to a sputter source, and inert gas (80 to 100 sccm) and nitrogen (greater than 0 and less than or equal to 100 sccm) are supplied to an ion source to generate plasma and deposit the coating, while a nitrogen partial pressure in the chamber is adjusted to greater than 0 and less than or equal to 50%;

to form the second buffer layer, inert gas (80 to 100 sccm) and nitrogen (greater than 0 and less than or equal to 100 sccm) are supplied to the sputter source, and inert gas (80 to 100 sccm) and hydrocarbon gas (12 to 14.5 sccm) are supplied to the ion source to generate plasma and deposit the coating, while the nitrogen partial pressure in the chamber is lower than during the formation of the first buffer layer, and a hydrocarbon partial pressure is lower than during the formation of the top layer.

8. The method for forming a high-entropy alloy coating material according to claim 7 wherein:

a vacuum chamber is initially evacuated to $10^{-5}$ to $10^{-3}$ torr;

before forming the first buffer layer, a current of 30 to 120 mA and a voltage of 1000 to 2000 V are applied to an ion source;

inert gas is supplied at 10 to 20 sccm to perform plasma cleaning of the surface of the industrial roller.

9. A coating material applied to a surface of an industrial roller comprising a high-entropy alloy $Ni_aCo_bCr_cSi_dN_e$, where: 5<a<15, 5<b<15, 5<c<15, 25<d<40, 25<e<35, and a+b+c+d+e=100, wherein the industrial roller is a roller for manufacturing an electrode comprising an NCM (Ni, Co, Mn) cathode material for a secondary battery.

10. The coating material of claim 9, further comprising a first buffer layer made of Ni—Co—Cr—Si—N on the surface of the industrial roller and a second buffer layer made of Ni—Co—Cr—Si—N is formed on top of the first buffer layer, before forming the coating material, wherein the first and second buffer layers constitute a gradient layer in which the nitrogen (N) composition gradually increases in a direction from the surface of the industrial roller toward a top layer of the coating material.

11. A method for forming a high-entropy alloy coating material according to claim 9, comprising:

preparing an industrial roller and a high-entropy alloy target designed with the following composition: Ni: 17~25%, Co: 17~25%, Cr: 17~25%, Si: 25~49%;

loading the industrial roller into a chamber;

vacuumizing the chamber;

supplying nitrogen and inert gas into the chamber and generating plasma;

forming a high-entropy alloy coating material $Ni_aCo_bCr_cSi_dN_e$, where: 5<a<15, 5<b<15, 5<c<15, 25<d<40, 25<e<35, and a+b+c+d+e=100, on a surface of the industrial roller.

12. The method for forming a high-entropy alloy coating material according to claim 11, wherein:

inert gas (80 to 100 sccm) and nitrogen (greater than 0 and less than or equal to 100 sccm) are supplied to a sputter source;

plasma discharge gas consists of inert gas (80 to 100 sccm) and nitrogen (greater than 0 and less than or equal to 100 sccm);

inert gas (5 to 7 sccm) and nitrogen (5 to 7 sccm) are supplied to an ion source to generate plasma and deposit a coating material comprising a high-entropy alloy $Ni_aCo_bCr_cSi_dN_e$, where: 5<a<15, 5<b<15, 5<c<15, 25<d<40, 25<e<35, and a+b+c+d+e=100; and a nitrogen partial pressure is adjusted to 17 to 23% of a total pressure of inert gas and nitrogen to form the high-entropy alloy coating material as a top layer.

13. The method for forming a high-entropy alloy coating material according to claim 11, wherein:

before forming the high-entropy alloy coating material as a top layer, a first buffer layer composed of Ni—Co—Cr—Si—N is formed on the surface of the industrial roller, and a second buffer layer composed of Ni—Co—Cr—Si—N is formed on top of the first buffer layer;

inert gas (80 to 100 sccm) and nitrogen (greater than 0 and less than or equal to 100 sccm) are supplied to a sputter source, and inert gas (5 to 7 sccm) and nitrogen (5 to 7 sccm) are supplied to an ion source to generate plasma and form the buffer layers;

a nitrogen partial pressure in the chamber is adjusted to greater than 0 and less than or equal to 50%, and gradually increases as the first and second buffer layers are formed, thereby creating a gradient layer in which the nitrogen (N) content gradually increases from the surface of the industrial roller toward the top layer.

14. The method for forming a high-entropy alloy coating material according to claim 13, wherein:

a vacuum chamber is initially evacuated to $10^{-5}$ to $10^{-3}$ torr;

before forming the first buffer layer, a current of 30 to 120 mA and a voltage of 1000 to 2000 V are applied to an ion source;

inert gas is supplied at 10 to 20 sccm to perform plasma cleaning of the surface of the industrial roller.

15. A coating material applied to a surface of an industrial roller, comprising:

a first buffer layer made of a Ni—Co—Cr—Si—C alloy, a second buffer layer made of a Ni—Co—Cr—Si—C alloy formed on top of the first buffer layer, and a top layer formed on the second buffer layer, comprising a high-entropy alloy represented by $Ni_aCo_bCr_cSi_dC_f$, where 3<a<10, 3<b<10, 3<c<10, 5<d<15, 55<f<86, and a+b+c+d+f=100, wherein the industrial roller is for manufacturing an electrode comprising NCM (Ni, Co, Mn) cathode active material, used in a secondary battery.

16. The coating material of claim 15, wherein the first and second buffer layers have a gradually increasing carbon (C) content in a gradient layer from the surface of the industrial roller toward the top layer.

17. The method for forming a high-entropy alloy coating material according to claim 15, comprising:

preparing an industrial roller and a high-entropy alloy target designed with the following composition: Ni: 17~25%, Co: 17~25%, Cr: 17~25%, Si: 25~49%;

loading the industrial roller into a chamber;

vacuumizing the chamber;

supplying inert gas, and hydrocarbon gas into the chamber and generating plasma;

forming a high-entropy alloy coating material $Ni_aCo_bCr_cSi_dC_f$, where: 3<a<10, 3<b<10, 3<c<10, 5<d<15, 55<f<86, and a+b+c+d +f=100, on a surface of the industrial roller.

18. The method for forming a high-entropy alloy coating material according to claim 17, wherein:

a first and second buffer layer and a top layer are formed using Ni—Co—Cr—Si—C, the carbon (C) content is gradually increased within the first and second buffer layer to create a gradient layer, while the top layer is maintained at a controlled predetermined ratio;

to form the first and second buffer and the top layer:

inert gas (50 to 80 sccm) is supplied to a sputter source, hydrocarbon gas (12 to 14.5 sccm) is supplied to an ion source to generate plasma;

a hydrocarbon partial pressure in the chamber is adjusted to 15 to 22%, and gradually increased as the first and second buffer layers are formed;

during the formation of the top layer, the partial pressure of hydrocarbon gas is adjusted to 19 to 22% of the total chamber pressure, including inert gas and hydrocarbon.

19. The method for forming a high-entropy alloy coating material according to claim 18, wherein:

an ion source current is controlled within a range of 100 to 200 mA to regulate mechanical properties of the coating material.

20. The method for forming a high-entropy alloy coating material according to claim 18, wherein:

a vacuum chamber is initially evacuated to $10^{-5}$ to $10^{-3}$ torr;

before forming the first buffer layer, a current of 30 to 120 mA and a voltage of 1000 to 2000 V are applied to an ion source;

inert gas is supplied at 10 to 20 sccm to perform plasma cleaning of the surface of the industrial roller.

21. A coating material applied to a surface of an industrial roller, comprising a high-entropy alloy $Ni_aCo_bCr_cSi_d$, where: 17≤a≤25, 17≤b≤25, 17≤c≤25, 25≤d≤49, and a+b+c+d=100, wherein the industrial roller is for manufacturing an electrode-comprising NCM (Ni, Co, Mn) cathode active material, used in a secondary battery.

22. A high-entropy alloy target, comprising Ni: 17-25%, Co: 17-25%, Cr: 17-25%, and Si: 25-49%, wherein the high-entropy alloy target is manufactured using one of the following methods:

casting, sintering, or alloy powder production through atomization followed by sintering, and the high-entropy alloy target is used in a method for forming a coating material on a surface of an industrial roller by generating plasma inside a chamber supplied with inert gas and hydrocarbon gas, or nitrogen and inert gas wherein the coating material comprises a high-entropy alloy represented by $Ni_aCo_bCr_cSi_dC_f$, where 3<a<10, 3<b<10, 3<c<10, 5<d<15, 55<f<86, and a+b+c+d+f=100, or by $Ni_aCo_bCr_cSi_dN_e$, where 5<a<15, 5<b<15, 5<c<15, 25<d<40, 25<e<35, and a+b+c+d+e=100.

* * * * *